United States Patent
Miura et al.

(10) Patent No.: US 11,328,901 B2
(45) Date of Patent: May 10, 2022

(54) DEPOSITION METHOD

(71) Applicant: Tokyo Electron Limited, Tokyo (JP)

(72) Inventors: Shigehiro Miura, Yamanashi (JP); Masato Yonezawa, Iwate (JP); Takehiro Fukada, Iwate (JP); Yoshitaka Enoki, Iwate (JP); Yuji Sawada, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 233 days.

(21) Appl. No.: 16/826,491

(22) Filed: Mar. 23, 2020

(65) Prior Publication Data

US 2020/0312621 A1  Oct. 1, 2020

(30) Foreign Application Priority Data

Mar. 29, 2019 (JP) .............................. JP2019-067802

(51) Int. Cl.
*H01J 37/32* (2006.01)
*H01L 21/02* (2006.01)
*C23C 16/455* (2006.01)
*C23C 16/40* (2006.01)

(52) U.S. Cl.
CPC ........ *H01J 37/3211* (2013.01); *C23C 16/401* (2013.01); *C23C 16/45536* (2013.01); *C23C 16/45544* (2013.01); *H01J 37/32449* (2013.01); *H01L 21/0228* (2013.01); *H01L 21/02164* (2013.01); *H01L 21/02274* (2013.01)

(58) Field of Classification Search
None
See application file for complete search history.

(56) References Cited

U.S. PATENT DOCUMENTS

2013/0087097 A1* 4/2013 Kato .................... H01J 37/3211
118/663

FOREIGN PATENT DOCUMENTS

JP  2013-135154  7/2013

* cited by examiner

*Primary Examiner* — Joel G Horning
(74) *Attorney, Agent, or Firm* — IPUSA, PLLC

(57) ABSTRACT

A deposition method performed by a deposition apparatus is provided. The deposition apparatus includes an antenna that forms an inductive magnetic field in a plasma processing region; and a rotary table that revolves a substrate around a rotational center of the rotary table. The method includes: supplying an ignition gas containing a noble gas and an additive gas to the plasma processing region; setting electric power supplied to the antenna to a first predetermined value to form a plasma of the ignition gas; increasing the electric power to a second predetermined value; stopping the supply of the additive gas; switching a gas supplied to the plasma processing region from the ignition gas to a gas for forming the film; and lifting an end of the antenna on a side closer to the rotational center while maintaining a height of another end of the antenna.

9 Claims, 10 Drawing Sheets

DEPOSITION METHOD

CROSS-REFERENCE TO RELATED APPLICATIONS

This patent application is based upon and claims priority to Japanese Patent Application No. 2019-067802 filed on Mar. 29, 2019, the entire contents of which are incorporated herein by reference.

TECHNICAL FIELD

The present disclosure relates to a deposition method.

BACKGROUND

Patent Document 1 describes the ALD (Atomic Layer Deposition) method in which reaction products are deposited onto a substrate by alternately supplying, to the substrate, at least two types of reaction gases that react with each other. In Patent Document 1, a substrate is sent to a first processing region, a second processing region, and a plasma processing region, by disposing the substrate horizontally around the rotational center of a rotary table and by rotating the substrate together with the rotary table. In the first processing region, a silicon-containing gas (e.g., an organic aminosilane gas) is fed to the substrate and the silicon-containing gas is adsorbed to the substrate. In the second processing region, an oxidation gas (e.g., ozone gas) is supplied to the substrate to oxidize the organic aminosilane gas adsorbed to the substrate in advance, thereby forming a silicon oxide film on the substrate. In the plasma processing region, a refining gas (e.g., a mixture of argon gas and oxygen gas) is supplied to the substrate, and the silicon oxide film formed on the substrate in advance is refined.

CITATION LIST

Patent Document

[Patent Document 1] Japanese Laid-open Patent Application Publication No. 2013-135154

SUMMARY

One aspect of the present disclosure provides a technique that is capable of suppressing damage to the substrate and generating plasma stably.

According to one aspect of the present disclosure, a method of depositing a film on a substrate in a deposition apparatus is provided. The deposition apparatus includes an antenna configured to form an inductive magnetic field in a plasma processing region; a radio frequency power supply electrically connected to the antenna via a matcher; and a rotary table on which the substrate is placed, the rotary table being configured to revolve the substrate around a rotational center of the rotary table. The method includes: supplying an ignition gas to the plasma processing region through which the substrate passes, the ignition gas containing a noble gas and an additive gas that causes Penning effect by being added to the noble gas; setting output power of the radio frequency power supply to a first predetermined value, thereby causing the ignition gas to be formed into a plasma; increasing the output power of the radio frequency power supply from the first predetermined value to a second predetermined value greater than the first predetermined value; stopping supply of the additive gas to the plasma processing region after the output power of the radio frequency power supply is set to the first predetermined value; switching a gas to be supplied to the plasma processing region from the ignition gas after the output power of the radio frequency power supply is increased to the second predetermined value and supply of the additive gas is stopped; and lifting an end portion of the antenna on a side closer to the rotational center of the rotary table while maintaining a height of another end portion of the antenna, after the output power of the radio frequency power supply is increased to the second predetermined value.

DETAILED DESCRIPTION OF EMBODIMENTS

Figure 1:
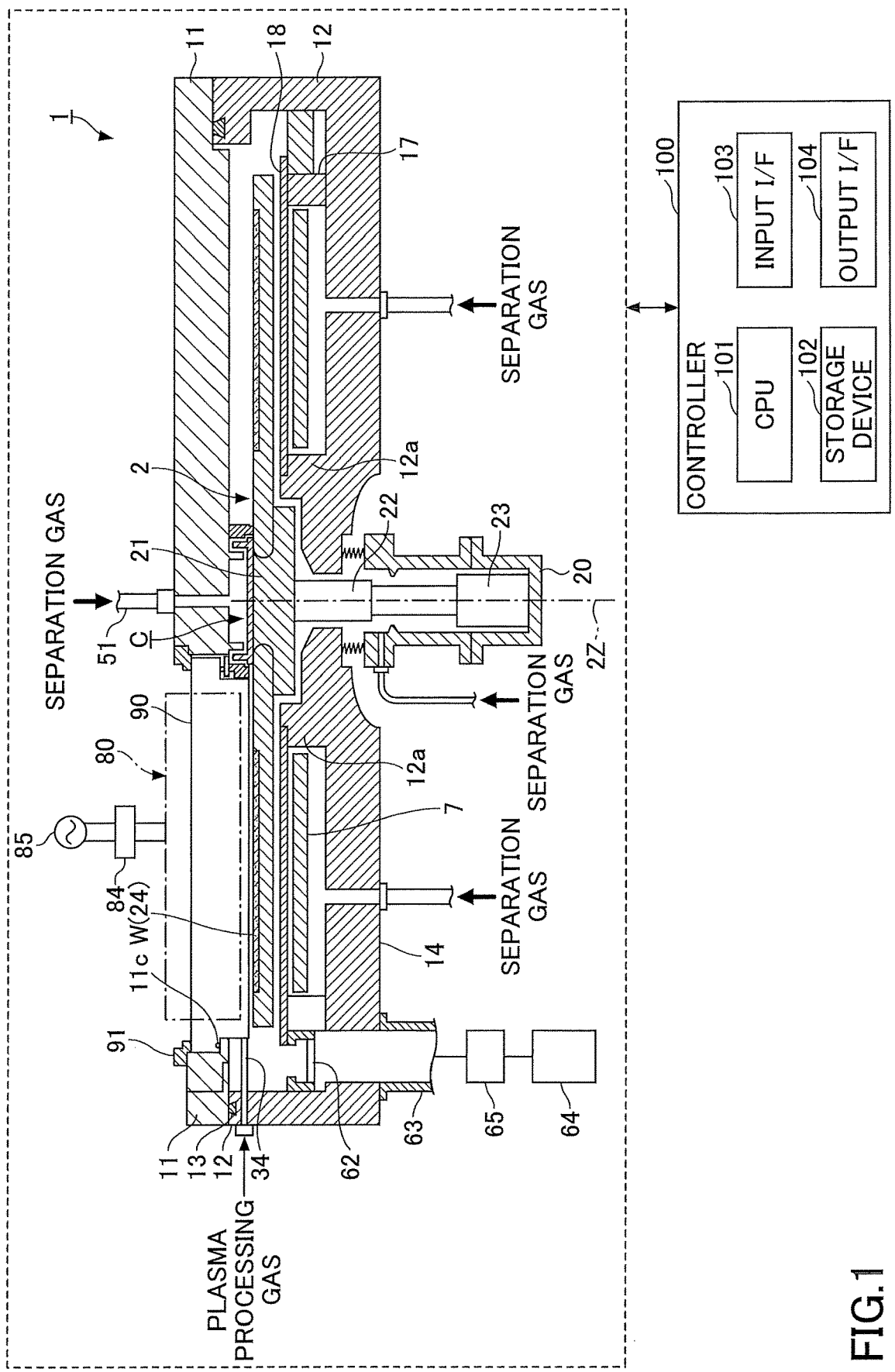
FIG. 1 is a cross-sectional view of a deposition apparatus according to an embodiment.

Hereinafter, embodiments of the present disclosure will be described with reference to the drawings. In each drawing, the same or corresponding structures are indicated by the same or corresponding reference numerals and the description thereof may be omitted.

(Deposition Apparatus)

Figure 2:
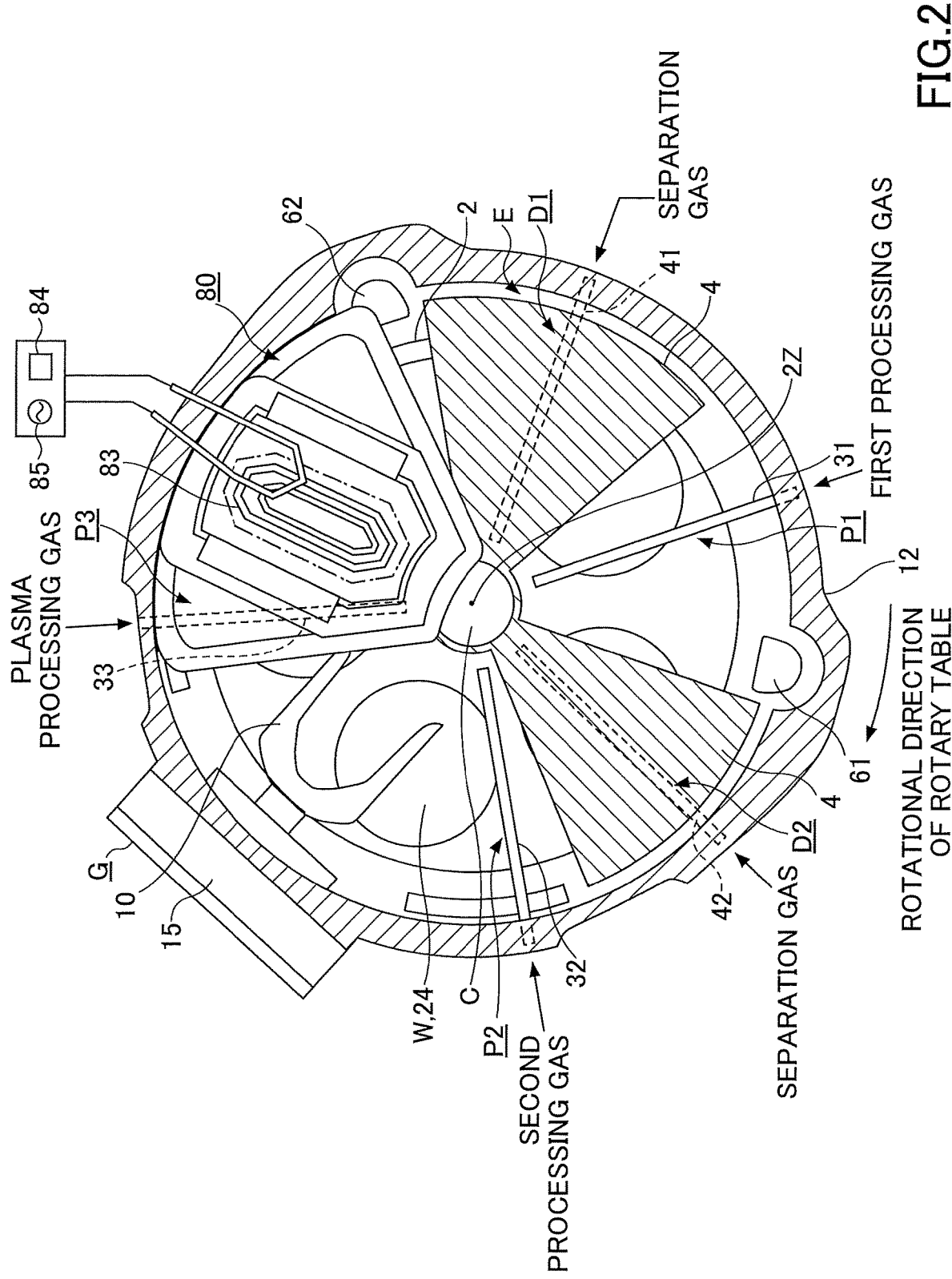
FIG. 2 is a plan view illustrating the internal structure of a processing vessel according to the embodiment.
Figure 3:
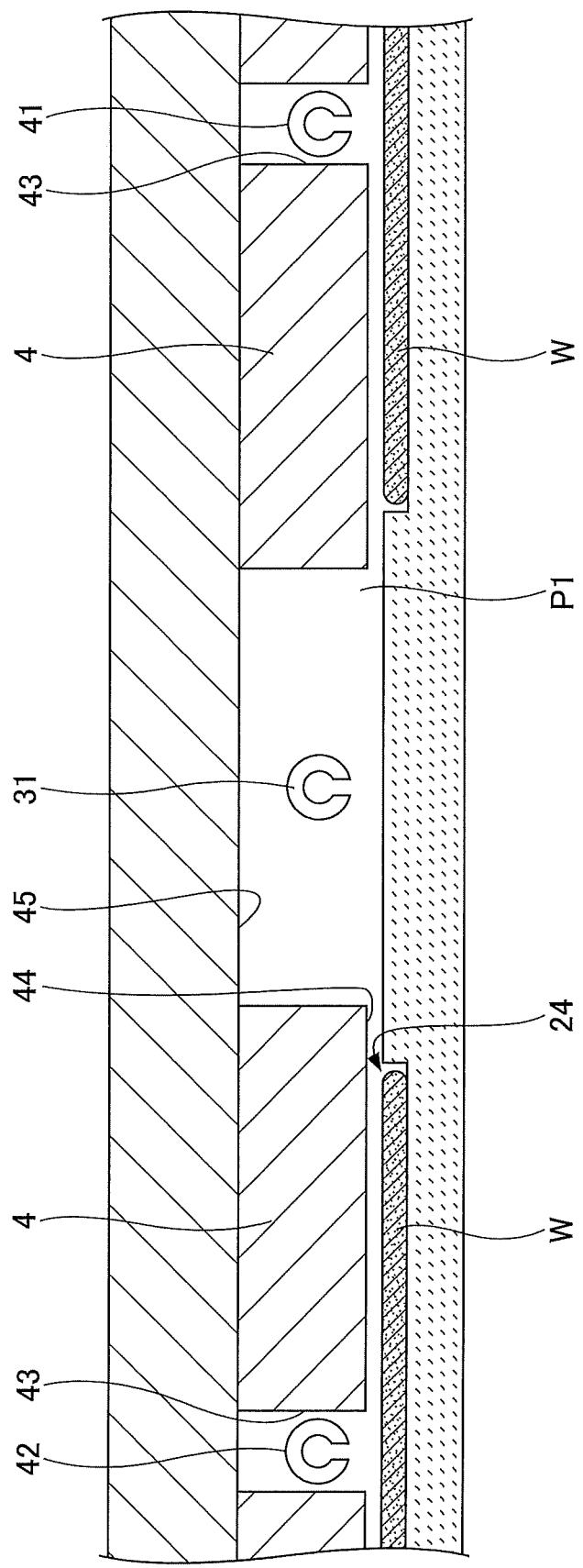
FIG. 3 is a cross-sectional view of a first processing region, a separation region, and a second processing region cut along the rotational direction of a rotary table according to the embodiment.

FIG. 1 is a cross-sectional view of a deposition apparatus according to an embodiment. FIG. 2 is a plan view illustrating an internal structure of a processing vessel according to the present embodiment. FIG. 3 is a cross-sectional view of a first processing region, a separation region, and a second processing region according to the present embodiment that are cut along a rotational direction of a rotary table.

The deposition apparatus forms a film on the substrate W using the atomic layer deposition (ALD) method. The substrate W may be a semiconductor substrate such as a silicon wafer. The substrate W may include an undercoat film. An example of the film formed by the deposition apparatus includes a silicon oxide film. The silicon oxide film is formed on the substrate W by alternately supplying a silicon-containing gas (e.g., an organic aminosilane gas) and an oxidation gas (e.g., an ozone gas) to the substrate W. The deposition apparatus refines the silicon oxide film formed on the substrate W with a refining gas.

The deposition apparatus includes a flat processing vessel 1 having a substantially circular planar shape, and a rotary table 2 provided in the processing vessel 1 having a rotational center (also referred to as a "rotational center line") 2Z at the center of the processing vessel 1. The processing vessel 1 includes a vessel body 12 having a cylindrical shape with a bottom, and a detachable top plate 11 that is hermetically attached to an upper surface of the vessel body 12 via a sealing member 13 such as an O-ring.

As illustrated in FIG. 2, a conveying port 15 of the substrate W is formed on a side wall of the processing vessel 1. An external transfer arm 10 passes through the conveying port 15, and stands by above the rotary table 2. Multiple (e.g., five) recesses 24 are provided on an upper surface of the rotary table 2 around the rotational center line 2Z. Each of the recesses 24 is formed in a circular shape. A diameter of the recess 24 is greater than a diameter of the substrate W. The substrate W is placed horizontally on an inner bottom surface of the recess 24. When the substrate W is placed in the recess 24, an upper surface of the substrate W and the upper surface of the rotary table 2 are at the same level. Three pin holes are formed on the inner bottom surface of the recess 24, and a lift pin is arranged at a position of each of the three pin holes. The three lift pins pass the substrate W between the transfer arm 10 and the rotary table 2 by raising and lowering the substrate W while supporting the substrate W from below. The conveying port 15 is opened and closed by a gate valve G.

As illustrated in FIG. 1, the rotary table 2 is fixed to a cylindrical core part 21 at the center of the rotary table 2. The core part 21 is fixed to an upper end portion of a rotating shaft 22. The rotating shaft 22 extends downward vertically, passes through the bottom portion 14 of the processing vessel 1, and is connected to an actuator 23. The rotating shaft 22 and the actuator 23 are housed within a cylindrical casing 20. The casing 20 is hermetically attached to a bottom surface of a bottom portion 14 of the processing vessel 1. When the actuator 23 rotates the rotary table 2, the recess 24 are rotated about the rotational center line 2Z of the rotary table 2, and the substrate W placed in the recess 24 rotates.

A heater 7 is provided below the rotary table 2. The heater 7 heats the substrate W on the rotary table 2 by heating the rotary table 2. The temperature of the substrate W may be, for example, 450° C. The heater 7 is disposed in a space surrounded by the bottom portion 14 of the processing vessel 1, an inner ring 12a projecting upward from the bottom portion 14 of the processing vessel 1, an outer ring 17 arranged concentrically with the inner ring 12a, and a lid 18.

As illustrated in FIG. 2, processing gas nozzles 31 and 32, a plasma processing gas nozzle 33, and separation gas nozzles 41 and 42 are radially disposed above the rotary table 2. In FIG. 2, the plasma processing gas nozzle 33, the separation gas nozzle 41, the processing gas nozzle 31, the separation gas nozzle 42, and the processing gas nozzle 32 are arranged in this order clockwise (rotational direction of the rotary table 2). These nozzles 31, 32, 33, 41, and 42 extend, through an outer peripheral wall of the vessel body 12, to a central region of the vessel body 12 horizontally in a radial direction of the vessel body 12. A plasma generator 80 is provided above the plasma processing gas nozzle 33. Details of the plasma generator 80 will be described below.

The processing gas nozzle 31 includes multiple discharge holes arranged at intervals in a longitudinal direction of the processing gas nozzle 31, and discharges a first processing gas from the multiple discharge holes toward the rotary table 2. The first processing gas is a silicon-containing gas, for example. For example, an organic aminosilane gas may be used as the silicon-containing gas. A region within the processing vessel 1, in which the silicon-containing gas is adsorbed to the substrate W, is referred to as a first processing region P1. The processing gas nozzle 31 is disposed in the first processing region P1.

The processing gas nozzle 32 includes multiple discharge holes arranged at intervals in a longitudinal direction of the processing gas nozzle 32, and discharges a second processing gas from the multiple discharge holes toward the rotary table 2. The second processing gas is an oxidation gas that oxidizes the silicon-containing gas adsorbed to the substrate W. For example, ozone ($O_3$) gas may be used as the oxidation gas. The region within the processing vessel 1, in which the silicon-containing gas adsorbed to the substrate W is oxidized to form the silicon oxide film, is referred to as a second processing region P2. The processing gas nozzle 32 is disposed in the second processing region P2.

The plasma processing gas nozzle 33 includes multiple discharge holes arranged at intervals in a longitudinal direction of the plasma processing gas nozzle 33, and discharges a refining gas from the multiple discharge holes toward the rotary table 2. The refining gas is formed into a plasma to refine the silicon oxide film. The refining gas contains, for example, argon (Ar) gas and oxygen ($O_2$) gas. The refining gas further contains hydrogen ($H_2$) gas in addition to argon gas and oxygen gas. A region within the processing vessel 1, in which the plasma is formed, is referred to as a plasma processing region P3. The plasma processing gas nozzle 33 is disposed in the plasma processing region P3.

Another nozzle may be further disposed in the plasma processing region P3 in addition to the plasma processing gas nozzle 33. Examples of the another nozzle include a nozzle for selectively supplying the refining gas to a portion of the rotary table 2 near the rotational center line 2Z, and a nozzle for selectively supplying the refining gas to a portion of the rotary table 2 near the outer periphery. In a case in which multiple nozzles are provided in the plasma processing region P3, the respective multiple nozzles may discharge different gases, or may discharge the same gas.

The separation gas nozzle 42 includes multiple discharge holes arranged at intervals in a longitudinal direction of the separation gas nozzle 42, and discharges a separation gas from the multiple discharge holes toward the rotary table 2. The separation gas prevents the silicon-containing gas from being mixed with the oxidation gas, and forces these gases into exhaust ports 61 and 62 respectively. For example, the silicon-containing gas is mainly exhausted from the exhaust port 61, and the oxidation gas is mainly exhausted from the exhaust port 62. For example, nitrogen ($N_2$) gas may be used as the separation gas. A region that prevents the silicon-containing gas and the oxidation gas from being mixed is referred to as a separation region D2. The separation gas nozzle 42 is disposed in the separation region D2.

In order to increase the pressure of the separation gas relative to the pressure of the silicon-containing gas or the oxidation gas in the separation region D2, so that entry of the silicon-containing gas or the oxidation gas into the separation region D2 is suppressed, a ceiling surface 44 of the separation region D2 is formed to be lower than a ceiling surface 45 of the first processing region P1 and a ceiling surface of the second processing region P2, as illustrated in FIG. 3. The ceiling surface 44 of the separation region D2 is formed by a lower surface of a projecting portion 4 projecting downward from the top plate 11 toward the rotary table 2. A groove 43 is formed in a circumferentially middle portion of the projecting portion 4. The groove 43 extends in a radial direction of the vessel body 12. Inside the groove 43, the separation gas nozzle 42 is housed.

The separation gas nozzle 41 includes multiple discharge holes arranged at intervals in a longitudinal direction of the separation gas nozzle 41, and discharges the separation gas from the multiple discharge holes toward the rotary table 2. The separation gas prevents the silicon-containing gas from mixing with the refining gas, and forces these gases into the exhaust ports 61 and 62 respectively. The silicon-containing gas is mainly exhausted from the exhaust port 61, and the refining gas is mainly exhausted from the exhaust port 62. For example, nitrogen ($N_2$) gas is used as the separation gas. A region that prevents the silicon-containing gas and the refining gas from being mixed is referred to as a separation region D1. The separation gas nozzle 41 is disposed in the separation region D1.

In order to increase the pressure of the separation gas relative to the pressure of the silicon-containing gas or the refining gas in the separation region D1, so that entry of the silicon-containing gas or the refining gas into the separation region D1 is suppressed, a ceiling surface of the separation region D1 is formed to be as low as the ceiling surface 44 of the separation region D2. That is, the ceiling surface of the separation region D1 is also formed by a lower surface of another projecting portion 4 projecting downward from the top plate 11 toward the rotary table 2. A groove 43 is formed in the circumferentially middle portion of the projecting portion 4. The groove 43 extends in the radial direction of the vessel body 12. The separation gas nozzle 41 is housed inside the groove 43.

As illustrated in FIG. 2, the plasma processing region P3, the separation region D1, the first processing region P1, the separation region D2, and the second processing region P2 are disposed around a central region C, and are arranged in this order clockwise (rotational direction of the rotary table 2). The central region C is a region which suppresses mixing of the silicon-containing gas, the oxidation gas, and the refining gas. As illustrated in FIG. 1, the separation gas is supplied to the central region C from above through the separation gas supply pipe 51. The separation gas flows outward in the radial direction from the central region C, to suppress mixing of the silicon-containing gas, the oxidation gas, and the refining gas in the central region C. For example, nitrogen ($N_2$) gas is used as the separation gas.

As illustrated in FIG. 2, the plasma processing region P3, the separation region D1, the first processing region P1, the separation region D2, and the second processing region P2 are disposed at an inner side of a ring-shaped exhaust region E in the radial direction. The exhaust region E is an area in which gases supplied to the interior of the processing vessel 1 are directed toward the exhaust ports 61 and 62 along the side wall of the vessel body 12. As illustrated in FIG. 1, the exhaust port 62 is connected to a vacuum pump 64 via an exhaust pipe 63. Similarly, the exhaust port 61 (FIG. 2) is also connected to a vacuum pump 64 via an exhaust pipe 63. A pressure controller 65 is provided in the exhaust pipe 63. The pressure controller 65 controls the gas pressure in the processing vessel 1.

Figure 4:
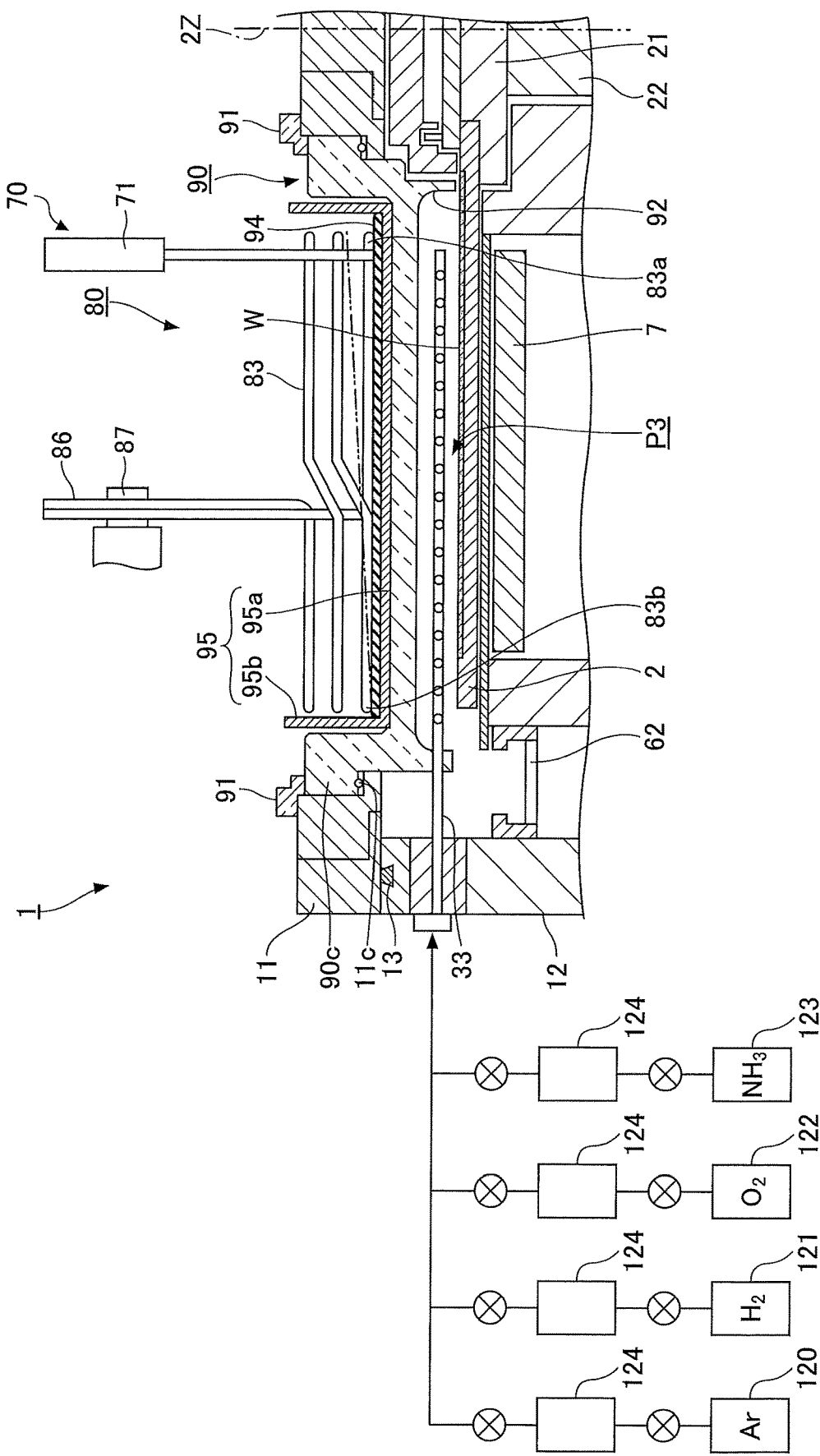
FIG. 4 is a cross-sectional view of a plasma generator according to the embodiment.
Figure 5:
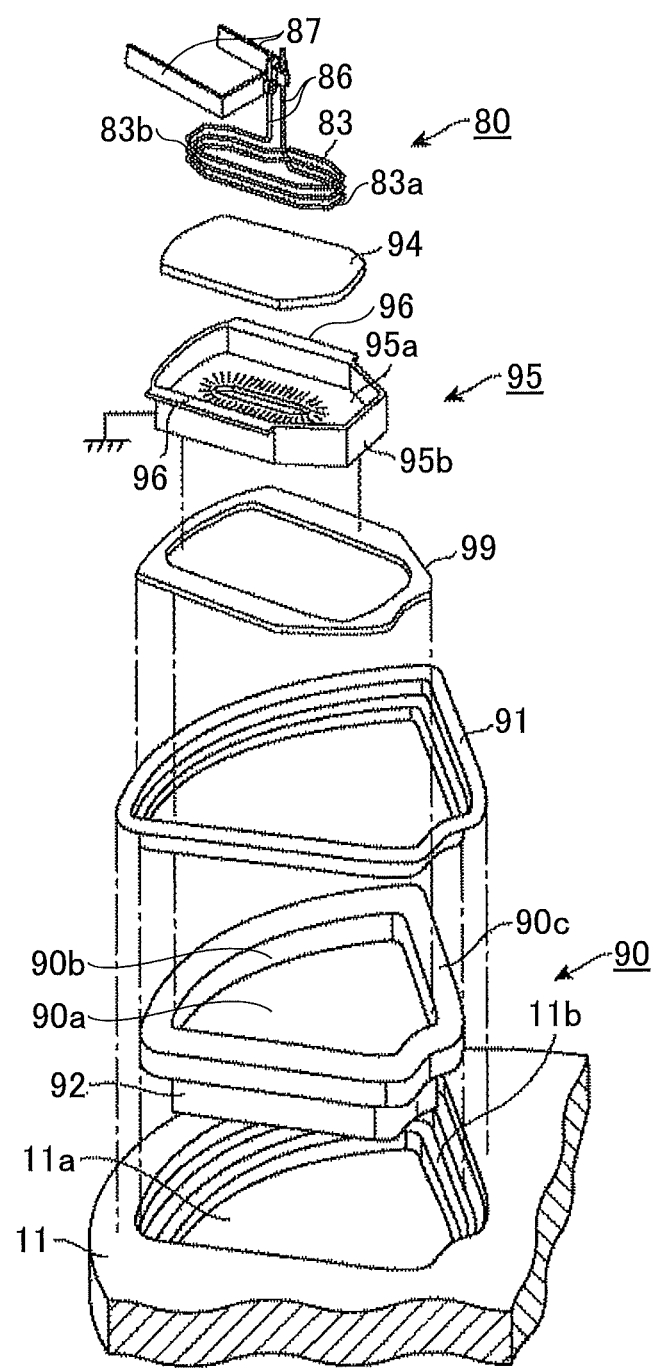
FIG. 5 is an exploded perspective view of the plasma generator according to the embodiment.
Figure 6:
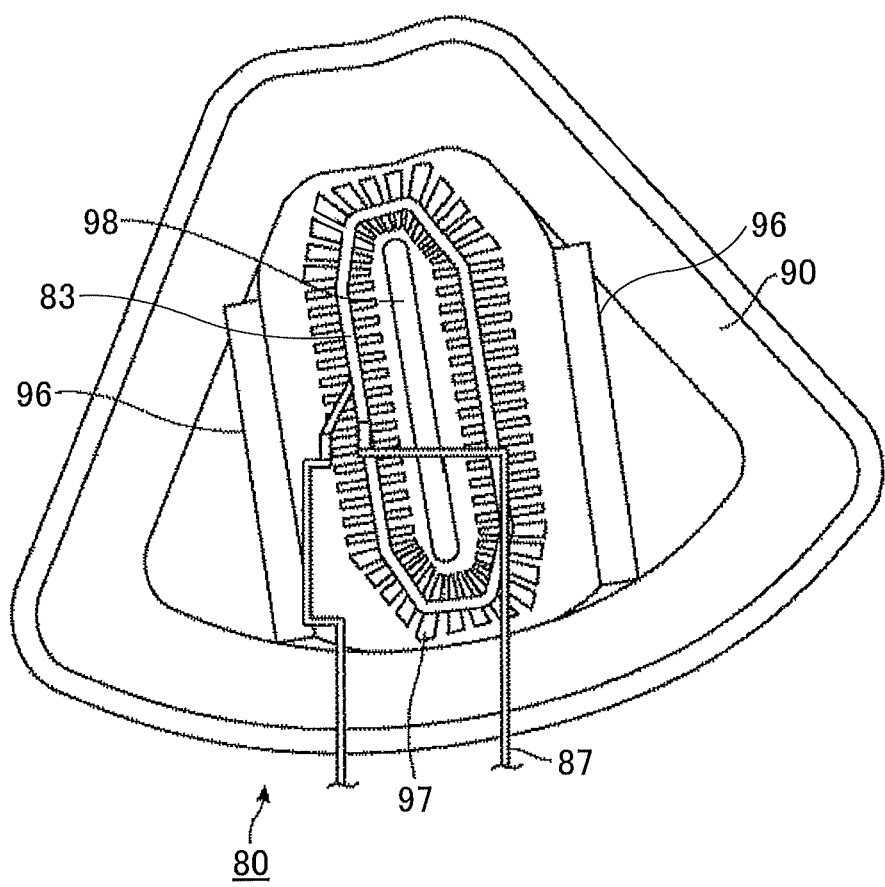
FIG. 6 is a schematic plan view of the plasma generator according to the embodiment.
Figure 7:
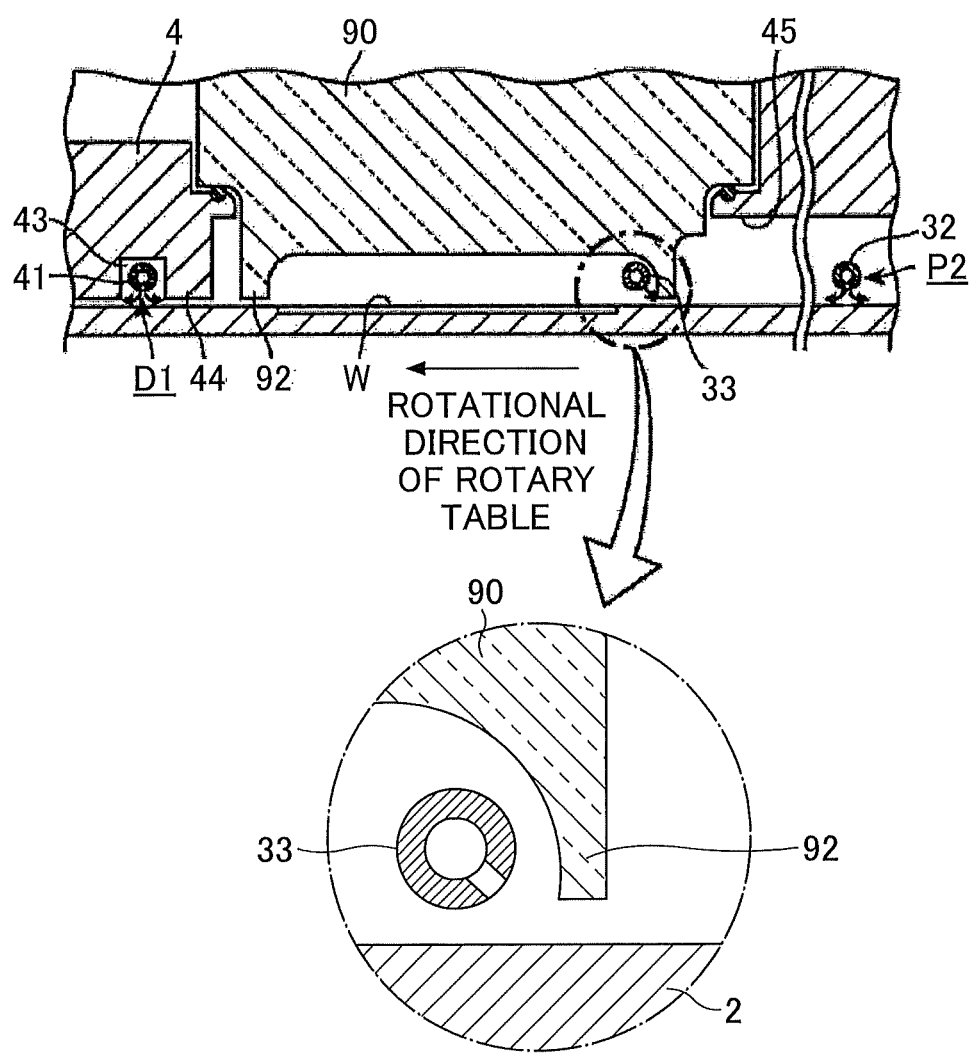
FIG. 7 is a cross-sectional view of a plasma processing region according to the embodiment cut along the rotational direction of the rotary table.

FIG. 4 is a cross-sectional view of the plasma generator according to the present embodiment. FIG. 5 is an exploded perspective view of the plasma generator according to the present embodiment. FIG. 6 is a schematic plan view of the plasma generator according to the embodiment. FIG. 7 is a cross-sectional view of the plasma processing region according to the present embodiment cut along the rotational direction of the rotary table.

The plasma generator 80 is provided at an opening 11a that vertically penetrates the top plate 11 of the processing vessel 1, as illustrated in FIG. 5. The opening 11a is formed generally in a shape of a fan in a plan view. The opening 11a expands gradually in a circumferential direction of the top plate 11, as approaching an outside region of the disk-shaped top plate 11. A step 11b is formed so that a size of the opening 11a is gradually reduced as proceeding downward vertically. The plasma generator 80 includes an antenna 83, a housing 90, a Faraday shield 95, and an insulating plate 94.

The housing 90 is formed of a dielectric such as quartz, and has a property of allowing magnetic force to pass. The housing 90 is formed in a shape of a fan in a plan view, so as to block the opening 11a of the top plate 11. The housing 90 includes a fan-shaped horizontal plate 90a, a side wall 90b extending upwardly from an outer periphery of the horizontal plate 90a, and a flange portion 90c extending horizontally from an upper edge of the side wall 90b. When the housing 90 is dropped into the opening 11a, the flange portion 90c is supported by the step 11b as illustrated in FIG. 4. The flange portion 90c is pushed toward the step 11b by the ring member 91. A gap between the flange portion 90c and the step 11b is sealed with a sealing member 11c, and the interior of the processing vessel 1 is kept airtight.

A protrusion 92 projecting downward is formed on a bottom surface of the horizontal plate 90a along a periphery of the horizontal plate 90a. The protrusion 92, the horizontal plate 90a, and the rotary table 2 are arranged to cover the plasma processing region P3. The protrusion 92 prevents $N_2$ gas and $O_3$ gas) from entering the plasma processing region P3 to suppress generation of $NO_x$ gas. The protrusion 92 also prevents the sealing member 11c from being exposed to a plasma, and thus prevents generation of particles. A plasma is deactivated before reaching the sealing member 11c because the plasma needs to detour around the protrusion 92 when reaching the sealing member 11c.

A plasma processing gas nozzle 33 extends into the plasma processing region P3 through a notch provided on the protrusion 92. As illustrated in FIG. 7, the gas discharge holes of the plasma processing gas nozzle 33 open downward in a diagonal direction, such that the gas discharge holes are directed to an upstream side of the rotational direction of the rotary table 2. Accordingly, $N_2$ gas and $O_3$ gas) are prevented from flowing into the plasma processing region P3 from a gap between the protrusion 92 and the rotary table 2.

The plasma processing gas nozzle 33 is connected to an argon gas source 120, a hydrogen gas source 121, an oxygen gas source 122, and an ammonia gas source 123 via a main pipe and multiple branch pipes branching from the main pipe, as illustrated in FIG. 4. A flow controller 124 is disposed in each of the multiple branch pipes. The plasma processing gas nozzle 33 may discharge, into the plasma processing region P3, one or more gases selected from argon gas, hydrogen gas, oxygen gas, and ammonia gas in any combination and at any mixing ratio.

Inside the housing 90, the Faraday shield 95 is provided. The Faraday shield 95 is formed of a metal plate, and is grounded. The metal plate may be, for example, a copper (Cu) plate, or a layered plate made by depositing a nickel (Ni) film and a gold (Au) film on a copper plate in this order. The Faraday shield 95 is formed in a shape of a box having an opening on its top. The Faraday shield 95 includes a horizontal plate 95a that is stacked on the horizontal plate 90*a* of the housing 90, and a vertical plate 95*b* extending upward from an outer periphery of the horizontal plate 95*a*. A pair of a left edge plate 96 and a right edge plate 96 is provided at the upper end of the vertical plate 95*b*, as illustrated in FIG. 5. A frame 99 is provided between the Faraday shield 95 and the housing 90 to support the left and right edge plates 96 from below. The frame 99 is supported by the housing 90.

Multiple slits 97 are provided on the horizontal plate 95*a* of the Faraday shield 95, as illustrated in FIG. 6. Each of the multiple slits 97 is formed so as to be perpendicular to an extending (winding) direction of a coiled metal wire consisting of the antenna 83, and the multiple slits 97 are provided at intervals along the extending (winding) direction of the metal wire. The slits 97 are arranged such that the set of the slits 97 forms an octagon extending in the radial direction of the rotary table 2. Also, an opening 98 is formed on the horizontal plate 95*a* of the Faraday shield 95. The opening 98 is arranged so as to be surrounded by the multiple slits 97.

Between an electric field and a magnetic field (electromagnetic field) generated around the antenna 83, the electric field is prevented from heading downward toward the substrate W, by the Faraday shield 95. Therefore, damage to electrical wiring that is formed on the substrate W in advance can be prevented. Further, the Faraday shield 95 allows the magnetic field to pass downwardly through the slits 97. This allows a plasma to be formed in the plasma processing region P3. The opening 98 also allows the magnetic field to pass, as well as the slit 97.

The insulating plate 94 is layered on the horizontal plate 95*a* of the Faraday shield 95 to cover the horizontal plate 95*a*, as illustrated in FIG. 4. The insulating plate 94 electrically insulates the antenna 83 from the Faraday shield 95. The insulating plate 94 may be, for example, a quartz plate having a thickness of approximately 2 mm.

The antenna 83 is formed, for example, by winding a metal wire. The metal wire is wound, for example, about a vertical axis, to form a three turn coil of an oval shape. The metal wire may be hollow. Cooling water to cool the metal wire is caused to flow inside the metal wire. At both ends of the metal wire forming the antenna 83, electrode rods 86 are formed by extending the metal wire vertically in an upward direction. The electrode rods 86 are held by electrode plates 87.

As illustrated in FIG. 2, the antenna 83 is electrically connected to a radio frequency power supply 85 via a matcher (matching device) 84. The maximum output power of the radio frequency power supply 85 may be 5000 W for example, and a frequency of the radio frequency power supply 85 may be 13.56 MHz for example. An inductive electric field and an inductive magnetic field are formed around the antenna 83 by supplying radio frequency power to the antenna 83 from the radio frequency power supply 85. As a result, an inductively coupled plasma is formed in the plasma processing region P3.

As illustrated in FIG. 4, the antenna 83 is provided on the insulating plate 94, and is surrounded by the vertical plate 95*b* of the Faraday shield 95. The antenna 83 is arranged such that the oval-shaped coil forming the antenna 83 faces the rotary table 2. Also, the oval-shaped coil of the antenna 83 is arranged so as to extend across a substrate passage region, in order that an entirety of the substrate W can be plasma processed. The substrate passing region is a ring-shaped region through which the substrate W passes as the rotation of the rotary table 2. A width of the substrate passage region is equal to the diameter of the substrate W.

In the following, in a plan view, an end portion of the oval-shaped coil of the antenna 83 positioned on a side closer to the rotational center line 2Z of the rotary table 2 is referred to as a "first end portion 83*a*", and the other end portion of the oval-shaped coil of the antenna 83 positioned on a side farther from the rotational center line 2Z is referred to as a "second end portion 83*b*".

With respect to the surface of the substrate W that is placed on the rotary table 2, velocity (circumferential speed) of a side of the substrate W closer to the rotational center line 2Z is slower than that of the opposite side of the substrate W. Thus, the side of the substrate W closer to the rotational center line 2Z is exposed to plasma longer than the opposite side.

Thus, the plasma generator 80 includes a tilting mechanism 70 that tilts the antenna 83, such that a bottom surface of the antenna 83 tilts as indicated by a dashed-and-double-dotted line in FIG. 4. The tilting mechanism 70 lifts the first end portion 83*a* of the antenna 83 positioned closer to the rotational center line 2Z while maintaining a height of the second end portion 83*b* of the antenna 83 that is farther from the rotational center line 2Z. While the antenna 83 is tilted, the lower surface of the antenna 83 inclines upwardly as approaching the rotational center line 2Z. Distance between the antenna 83 and the substrate W increases as approaching the rotational center line 2Z.

As the distance between the antenna 83 and the substrate W increases, an amount of attenuation of the magnetic field reaching the substrate W also increases. Accordingly, with respect to the surface of the substrate W that is placed on the rotary table 2, intensity of plasma at an edge of the surface on a side closer to the rotational center line 2Z is smaller than intensity of plasma at an edge of the surface on a side opposite the rotational center line 2Z. This intensity distribution of plasma can compensate for the difference in time during which the surface of the substrate W is exposed to plasma, and the surface of the substrate W can be uniformly processed.

The tilting mechanism 70 includes an actuator 71 that raises and lowers the first end portion 83*a* of the antenna 83 on the side closer to the rotational center line 2Z. The actuator 71 may include, for example, a motor and a motion translating mechanism that translates rotational motion of the motor to linear motion of the first end portion 83*a* of the antenna 83 on the side of the rotational center line 2Z. As the motion translating mechanism, for example, a ball screw may be used.

The deposition apparatus includes a controller 100, as illustrated in FIG. 1. The controller 100 may be configured by a computer for example, and may include a central processing unit (CPU) 101 and a storage device 102 such as a memory. The storage device 102 stores a program for controlling various processes performed in the deposition apparatus. The controller 100 controls operations of the deposition apparatus by causing the CPU 101 to execute the program stored in the storage device 102. The controller 100 may also include an input interface (input I/F) 103 and an output interface (output I/F) 104. The controller 100 receives signals from the outside through the input interface 103, and transmits signals to the outside through the output interface 104.

The program may be stored in a computer-readable storage medium, and may be installed in the storage device 102 of the controller 100 from the storage medium. Examples of the computer-readable storage medium include a hard disk (HD), a flexible disk (FD), a compact disc (CD), a magneto-optical disc (MO), and a memory card. Alternatively, the program may be downloaded from the server via the Internet and installed in the storage device 102 of the controller 100.

(Deposition Method)

Figure 8:
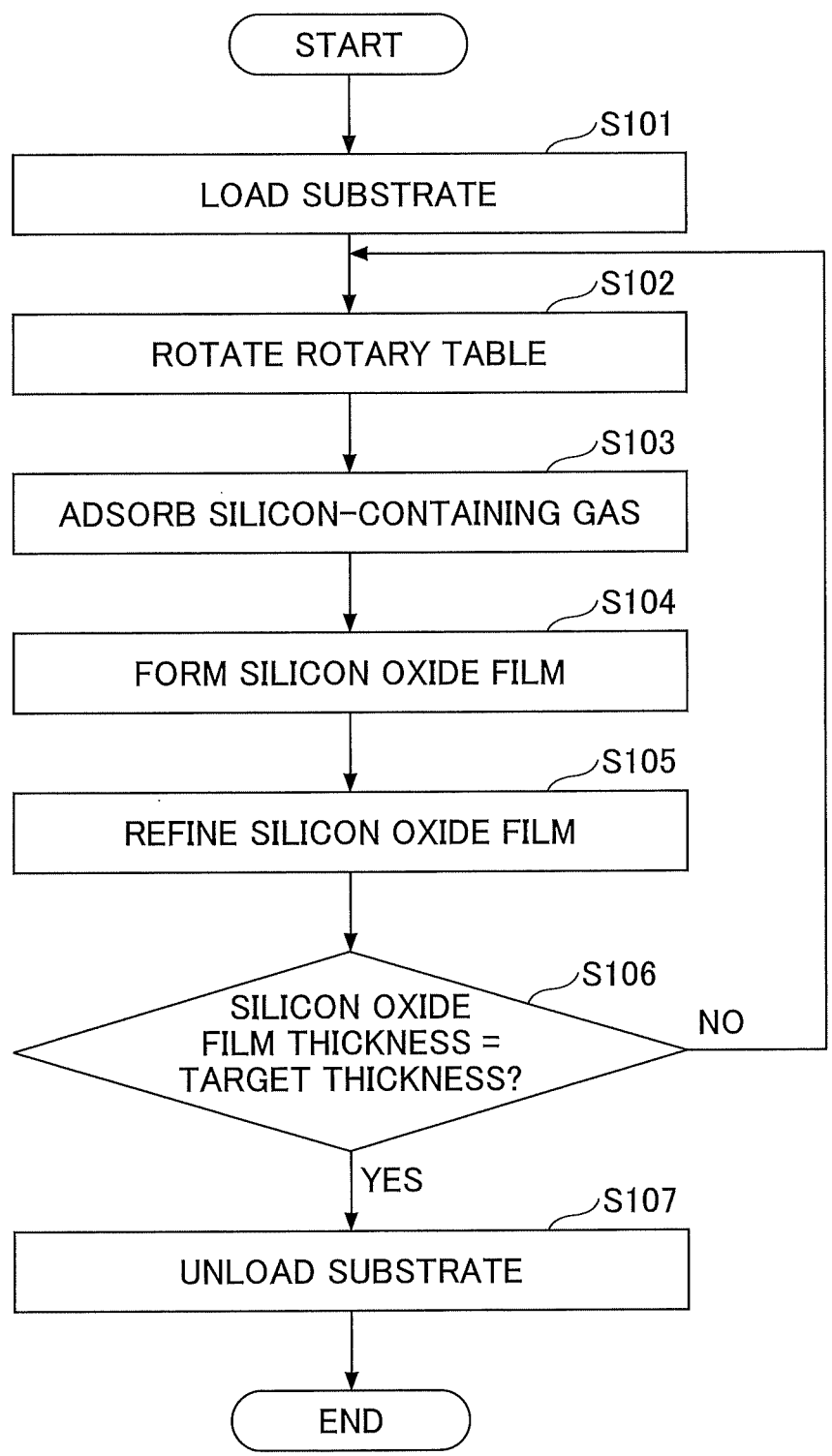
FIG. 8 is a flowchart illustrating a deposition method according to the embodiment.

FIG. 8 is a flowchart illustrating a deposition method according to the present embodiment. Steps S101 to S107 illustrated in FIG. 8 are performed under control of the controller 100.

The deposition method includes a step of loading a substrate W into the interior of the processing vessel 1 (step S101). In step S101, first, the gate valve G opens the conveying port 15. Subsequently, the transfer arm 10 passes through the conveying port 15 and stands by above the rotary table 2. Then, the lift pins receive the substrate W from the transfer arm 10, and place the received substrate W in the recess 24 of the rotary table 2. The transfer of the substrate W from the transfer arm 10 to the rotary table 2 is repeated while the rotary table 2 is intermittently rotated. As a result, for example, five substrates W are placed on the rotary table 2.

Thereafter, the gate valve G closes the conveying port 15. Subsequently, the vacuum pump 64 evacuates the interior of the processing vessel 1. When the pressure in the processing vessel 1 reaches a predetermined pressure, the separation gas nozzles 41 and 42 discharge $N_2$ gas at a predetermined flow rate, and the separation gas supply pipe 51 also discharges $N_2$ gas at a predetermined flow rate. At the same time, the pressure controller 65 controls (maintains) the pressure in the processing vessel 1 to the predetermined pressure. Next, the actuator 23 rotates the rotary table 2 at predetermined rotational speed, and the heater 7 heats the substrate W to a predetermined temperature. This operation corresponds to step S102 in FIG. 8.

Next, the processing gas nozzle 31 supplies a silicon-containing gas to the first processing region P1, and the processing gas nozzle 32 supplies oxidation gas to the second processing region P2. The plasma processing gas nozzle 33 supplies an ignition gas and a refining gas in this order to the plasma processing region P3, which will be described in detail below. Also, the radio frequency power supply 85 forms an inductively coupled plasma in the plasma processing region P3 by providing radio frequency power to the antenna 83, which will be described in detail below. As the controller 100 controls these gas supply operations while performing step S102 (while the rotary table 2 is rotated), steps S103 to S105 are performed.

That is, the deposition method includes a step of rotating the rotary table 2 at predetermined rotational speed so that the substrate W passes through the first processing region P1, the second processing region P2, and the plasma processing region P3 in this order (step S102).

Also, the deposition method includes a step of causing the substrate W, in the first processing region P1, to adsorb a silicon-containing gas (step S103). An example of the silicon-containing gas includes an organic aminosilane gas.

The deposition method further includes a step of forming a silicon oxide film on the substrate W in the second processing region P2 (step S104). The silicon oxide film is a reaction product made from the silicon-containing gas and the oxidation gas. An example of the oxidation gas includes ozone gas.

The deposition method further includes a step of refining the silicon oxide film in the plasma processing region P3 (step S105). An example of the refining gas includes a mixed gas of argon gas, oxygen gas, and hydrogen gas. The refining gas is formed into a plasma, and the plasma formed from the refining gas reforms the silicon oxide film. For example, impurities such as organic matter are released from the silicon oxide film. In addition, as elements of the silicon oxide film are rearranged, refinement (densification) of the silicon oxide film progresses. Furthermore, by the oxygen gas that is formed into a plasma, the silicon-containing gas on the substrate W that was not oxidized in the second processing region P2 is oxidized. If the refining gas includes hydrogen gas in addition to oxygen gas, OH groups are formed on the surface of the silicon oxide film. The OH group acts as an adsorption site of the silicon-containing gas when step S103 is performed next time.

If a thickness of the silicon oxide film is less than a target thickness (NO in step S106), the controller 100 executes step S102 and thereafter again. Whether or not the thickness of the silicon oxide film is the target thickness is determined based on a processing time or the like. Meanwhile, if the thickness of the silicon oxide film is the target thickness (YES in step S106), the controller 100 performs step S107.

The deposition method also includes a step of unloading the substrate W to the outside of the processing vessel 1 (step S107). In step S107, the gate valve G first opens the conveying port 15. Subsequently, the transfer arm 10 passes through the conveying port 15 and stands by above the rotary table 2. The lift pins then receive the substrate W from the rotary table 2 and pass the received substrate W to the transfer arm 10. The transfer of the substrate W from the rotary table 2 to the transfer arm 10 is repeated while the rotary table 2 is intermittently rotated.

Figure 9:
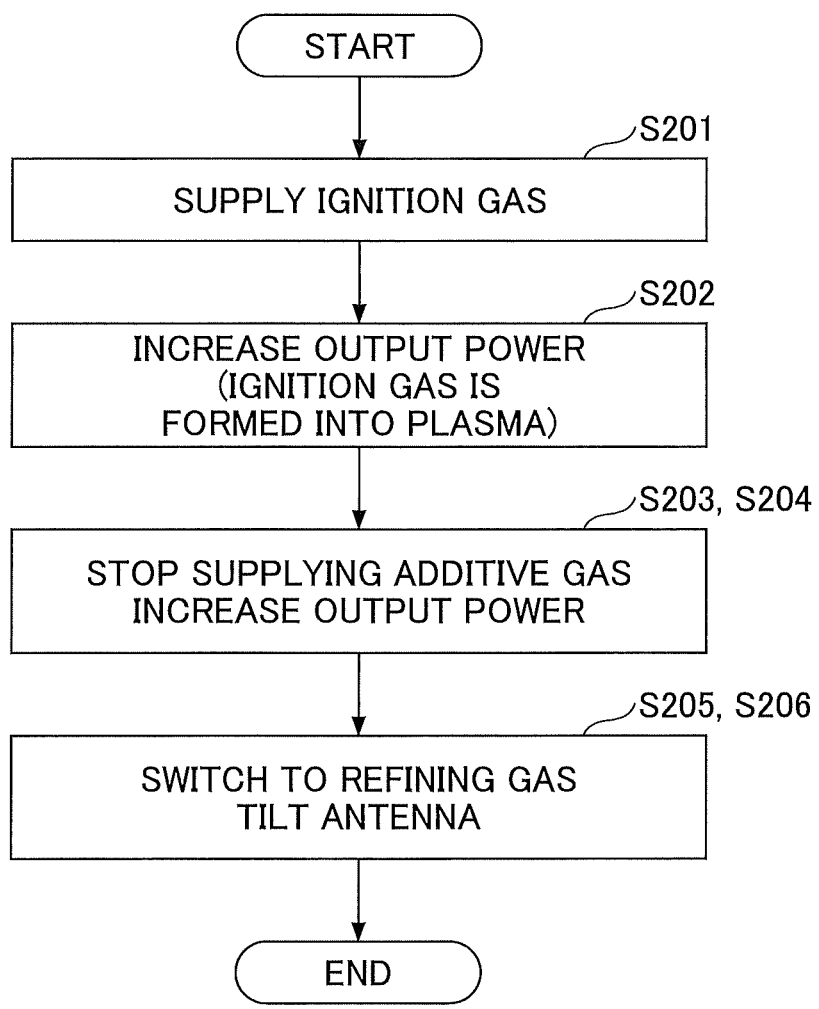
FIG. 9 is a flowchart illustrating a process of generating a plasma according to the embodiment.

FIG. 9 is a flowchart illustrating a process of generating a plasma according to the present embodiment. As illustrated in FIG. 9, the process of generating a plasma includes steps S201 to S206 to be described below. Steps S201 to S206 to be described below are performed under control of the controller 100, after the step of loading the substrate W (step S101) illustrated in FIG. 8 and before starting deposition of the silicon oxide film (steps S103 to S105). Steps S201 to S206 are performed while the rotary table 2 continues to rotate at the predetermined rotational speed. Further, the pressure inside the processing vessel 1 during execution of steps S201 to S206 is not particularly limited, but may be maintained at, for example, 2 Torr.

In a step of supplying the ignition gas (step S201), a plasma processing gas nozzle 33 supplies the ignition gas to the plasma processing region P3. The ignition gas contains a noble gas and an additive gas that causes the Penning effect (Penning ionization) by being added to the noble gas. The Penning effect can reduce output power of the radio frequency power supply 85 required for plasma ignition (generation). A low energy plasma can be produced, and damage to the substrate W by the plasma can be reduced.

For example, the ignition gas may include argon (Ar) gases as a noble gas, and may include ammonia ($NH_3$) gas as an additive gas. For example, the flow rate of the argon gas may be 15 slm, and the flow rate of the ammonia gas may be 50 sccm.

A combination of a noble gas and an additive gas contained in the ignition gas is not particularly limited. For example, the ignition gas may contain helium (He) gas as the noble gas, and may include argon gas, nitrogen gas, or ammonia gas as the additive gas.

In a first step of increasing the output power (step S202), the controller 100 increases the output power of the radio frequency power supply 85 to a first predetermined value. The first predetermined value is determined according to types of an ignition gas so that the ignition gas can be formed into a plasma. The first predetermined value may be, for example, 1000 W.

A step of stopping supply of the additive gas (step S203) and a second step of increasing the output power (step S204) are performed simultaneously in order to reduce processing time, that is, to improve productivity. The step of stopping supply of the additive gas (step S203) and the second step of increasing the output power (step S204) may not be performed completely simultaneously, and may be performed partially at the same time.

Note that either the step of stopping supply of the additive gas (step S203) or the second step of increasing the output power (step S204) may be performed first. In this case, the step of stopping supply of the additive gas (step S203) may be performed first, or the second step of increasing the output power (step S204) may be performed first.

In the step of stopping supply of the additive gas (step S203), the flow controller 124 decreases the flow rate of ammonia gas that is the additive gas from 50 sccm to 0 sccm. The time required to reduce the flow rate is, for example, approximately 1 second. By stopping the supply of ammonia gas, nitridation of the silicon oxide film by ammonia gas can be suppressed.

The plasma is not quenched (does not disappear) after the step of stopping supply of the additive gas (step S203). This is because a small amount of the additive gas remains in the plasma processing region P3, and because the output power of the radio frequency power supply 85 is increased from the first predetermined value to a second predetermined value (in step S204).

In the second step of increasing the output power (step S204), the controller 100 increases the output power of the radio frequency power supply 85 from the first predetermined value to the second predetermined value. Note that the second predetermined value is greater than the first predetermined value. This increases the power supplied from the radio frequency power supply 85 to the antenna 83 via the matcher 84. The second predetermined value is determined such that the silicon oxide film can be fully refined with a plasma formed from the refining gas. The second predetermined value may be 4000 W, for example.

The matcher 84 includes a variable capacitor and a motor that changes capacitance of the variable capacitor. The motor changes the capacitance of the variable capacitor such that output impedance of the radio frequency power supply 85 matches input impedance of the antenna 83.

Figure 10:
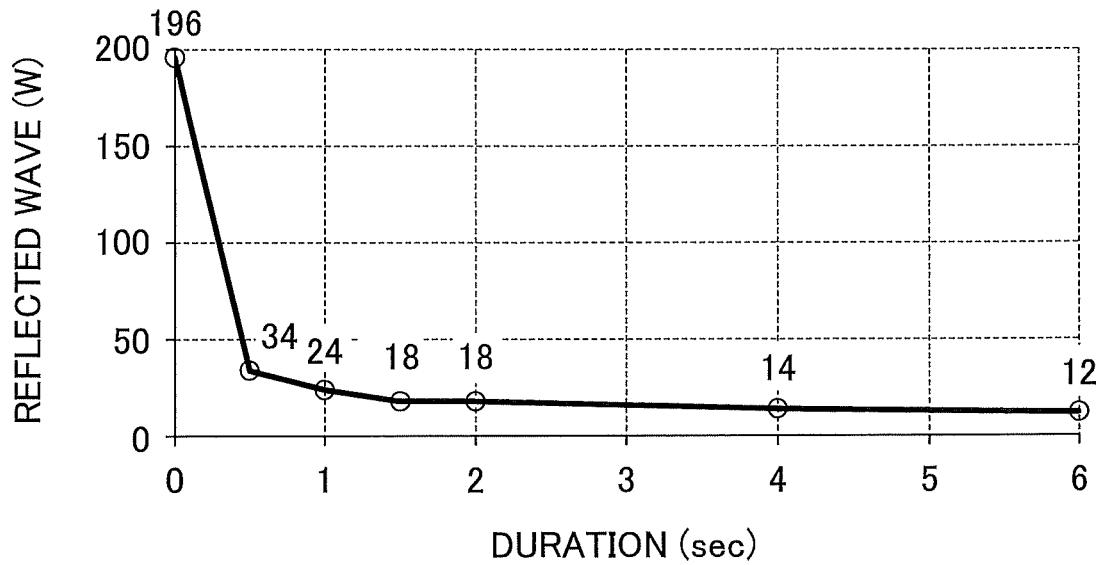
FIG. 10 is a diagram illustrating an example of experimental data indicating a relationship between the time required to increase output power in a second increasing step and the magnitude of a reflected wave.

FIG. 10 is a diagram illustrating an example of experimental data indicating a relationship between the time required to increase the output power in the second step of increasing the output power (step S204) and the magnitude of a reflected wave. If the duration of time required to increase the output power is short and the output power of the radio frequency power source 85 varies rapidly, the reflected wave is generated because the capacitance of the variable capacitor cannot be changed while following the change in the output power. Thus, only part of the output power of the radio frequency power source 85 is supplied to the antenna 83.

Therefore, the controller 100 performs the second step of increasing the output power (step S204) by taking a time of 0.5 seconds or more and 2 seconds or less. If the duration of step S204 is 0.5 seconds or more, the magnitude of the reflected wave can be reduced, thereby preventing the plasma from being quenched. Further, if the duration of step S204 is not greater than 2 seconds, because the processing time is reduced, productivity is improved. Even if the duration of step S204 is longer than 2 seconds, the reduction in the reflected wave is slight.

A step of switching gas to the refining gas (step S205) and a step of tilting the antenna 83 (step S206) are performed simultaneously to shorten the processing time, that is, to improve productivity. The step of switching gas to the refining gas (step S205) and the step of tilting the antenna 83 (step S206) are not required to be performed completely simultaneously, but may be performed partly at the same time.

Note that the step of switching gas to the refining gas (step S205) and the step of tilting the antenna 83 (step S206) are not required to be performed simultaneously. In this case, the step of switching gas to the refining gas (step S205) is performed first. The step of tilting the antenna 83 (step S206) may cause plasma extinction, because the tilting of the antenna 83 changes input impedance of the antenna 83. Therefore, the step of tilting the antenna 83 (step S206) is performed after the second step of increasing the output power (step S204). If the output power has been increased to the second predetermined value, the risk of plasma extinction is low even if the input impedance of the antenna 83 changes due to the tilting of the antenna 83.

In the step of switching gas to the refining gas (step S205), a gas that is formed into a plasma in the plasma processing region P3 is switched from the ignition gas to the refining gas. Specifically, the flow controller 124 switches the type of gas discharged from the plasma processing gas nozzle 33 to the refining gas. For example, the flow controller 124 increases the flow rate of oxygen gas from 0 sccm to 150 sccm, and also increases the flow rate of hydrogen gas from 0 sccm to 100 sccm. The flow controller 124 maintains the flow rate of argon gas at 15 slm.

In the step of tilting the antenna 83 (step S206), the tilting mechanism 70 lifts the first end portion 83a of the antenna 83 on the side of the rotational center line 2Z while maintaining the height of the second end portion 83b of the antenna 83 opposite the rotational center line 2Z. The lower surface of the antenna 83 inclines such that as a side of the lower surface closer to the rotational center line 2Z is positioned higher than the other side of the lower surface. The distance between the lower surface of the antenna 83 and the substrate W increases as the lower surface approaches the rotational center line 2Z.

As the distance between the antenna 83 and the substrate W increases, an amount of attenuation of the magnetic field reaching the substrate W also increases. Accordingly, with respect to the surface of the substrate W that is placed on the rotary table 2, intensity of plasma at an edge of the surface on a side closer to the rotational center line 2Z is smaller than intensity of plasma at an edge of the surface on a side opposite the rotational center line 2Z. This intensity distribution of plasma can compensate for the difference in time during which the surface of the substrate W is exposed to plasma, and the surface of the substrate W can be uniformly processed.

Figure 11:
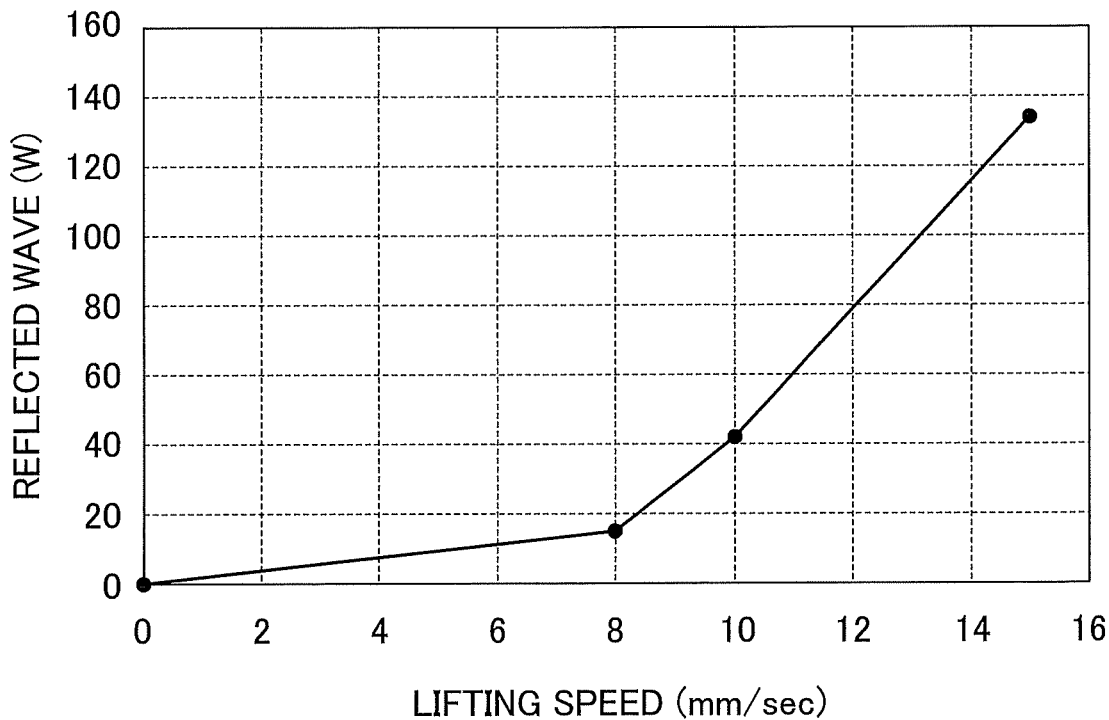
FIG. 11 is a diagram illustrating an example of experimental data indicating a relationship between speed of lifting the end of an antenna on a side closer to the rotational center and the magnitude of the reflected wave.

FIG. 11 is a diagram illustrating an example of experimental data indicating a relationship between speed of lifting the end of the antenna on the side of the rotational center line side and the magnitude of the reflected wave. If the first end portion 83a of the antenna 83 on the side of the rotational center line 2Z is lifted immediately, the input impedance of the antenna 83 rapidly varies. This will cause a large reflected wave to be generated and only a fraction of the output power of the radio frequency power source 85 is supplied to the antenna 83, because the capacitance of the variable capacitor cannot be changed while following the change in the input impedance of the antenna 83.

The controller 100 controls the speed of lifting the first end portion 83a of the antenna 83 on the side of the rotational center line 2Z to be 8 mm/sec or more and 12 mm/sec or less. If the lifting speed is less than 12 mm/sec, the magnitude of the reflected wave can be reduced and plasma extinction can be suppressed. If the lifting speed is 8 mm/sec or more, processing time is reduced and productivity is improved.

The embodiments of the deposition method according to the present disclosure are described above, but the present invention is not limited to the above-described embodiments. Various changes, modifications, substitutions, additions, deletions, and combinations are possible within the scope of the claims, and are of course within the technical scope of the present invention.

For example, the film to be formed is not limited to a silicon oxide film. In addition to a silicon oxide film, a metal oxide film may be formed. Further, a metal nitride film may be formed.

In addition, a gas (gas for forming a film on a substrate) that replaces the ignition gas is not limited to the refining gas. Any types of gas may be used as the gas for forming a film on a substrate as long as the gas can be formed into a plasma. For example, an oxidizing gas or a nitriding gas may be used.

The substrate W is not limited to a semiconductor substrate such as a silicon wafer, but may be a glass substrate or the like.

What is claimed is:

1. A method of depositing a film on a substrate in a deposition apparatus, the deposition apparatus including an antenna configured to form an inductive magnetic field in a plasma processing region; a radio frequency power supply electrically connected to the antenna via a matcher; and a rotary table on which the substrate is placed, the rotary table being configured to revolve the substrate around a rotational center of the rotary table, the method comprising:
   (a) supplying an ignition gas to the plasma processing region through which the substrate passes, the ignition gas containing a noble gas and an additive gas that causes Penning effect upon being added to the noble gas;
   (b) setting output power of the radio frequency power supply to a first predetermined value, thereby causing the ignition gas to be formed into a plasma;
   (c) increasing the output power of the radio frequency power supply from the first predetermined value to a second predetermined value greater than the first predetermined value;
   (d) stopping supply of the additive gas to the plasma processing region after step (b);
   (e) switching a gas to be supplied to the plasma processing region from the ignition gas to a gas for forming the film on the substrate after step (c) and step (d); and
   (f) lifting an end portion of the antenna on a side closer to the rotational center of the rotary table while maintaining a height of another end portion of the antenna, after step (c).

2. The method according to claim 1, wherein speed of lifting the end portion of the antenna on the side closer to the rotational center is equal to or greater than 8 mm/sec and is equal to or less than 12 mm/sec.

3. The method according to claim 1, wherein a time required for increasing the output power of the radio frequency power supply from the first predetermined value to the second predetermined value is equal to or greater than 0.5 seconds and equal to or less than 2 seconds.

4. The method according to claim 1, wherein step (c) and step (d) are performed simultaneously.

5. The method according to claim 1, wherein step (e) and step (f) are performed simultaneously.

6. The method according to claim 1, further comprising:
   rotating the rotary table such that the substrate passes through a first processing region, a second processing region, and the plasma processing region, in an order of the first processing region, the second processing region, and the plasma processing region;
   causing the substrate to adsorb a first processing gas in the first processing region;
   forming, in the second processing region, a film of a reaction product of the first processing gas and a second processing gas on the substrate; and
   refining, in the plasma processing region, the film with a plasma formed from the gas for forming the film.

7. The method according to claim 6, wherein
the first processing gas is a silicon-containing gas;
the second processing gas is an oxidation gas that oxidizes the silicon-containing gas adsorbed on the substrate; and
the reaction product is a silicon oxide film.

8. The method according to claim 7, wherein the gas for forming the film is a refining gas containing a noble gas, oxygen gas, and hydrogen gas.

9. The method according to claim 1, wherein the noble gas contained in the ignition gas is argon gas; and the additive gas is ammonia gas.

* * * * *